United States Patent [19]

McConkle et al.

[11] Patent Number: 4,670,653

[45] Date of Patent: Jun. 2, 1987

[54] INFRARED DETECTOR AND IMAGING SYSTEM

[75] Inventors: Charles C. McConkle, Corona; William F. O'Neil, Laguna Hills; Michael J. Meier, Diamond Bar; Thomas P. Fjeldsted, West Covina; James L. Thomas, Placentia; Arthur F. Pfeifer, Whittier, all of Calif.

[73] Assignee: Rockwell International Corporation, El Segundo, Calif.

[21] Appl. No.: 767,582

[22] Filed: Oct. 10, 1985

[51] Int. Cl.$^4$ .......................... H01L 25/00; G01T 1/22
[52] U.S. Cl. .................................. 250/330; 250/370; 250/332
[58] Field of Search ........... 250/330, 332, 334, 370 G; 358/113

[56] References Cited

U.S. PATENT DOCUMENTS 4,039,833 8/1977 Thom .................................. 250/332
4,190,769 2/1980 Redman .............................. 250/330

Primary Examiner—Janice A. Howell
Attorney, Agent, or Firm—H. Fredrick Hamann; George A. Montanye; James F. Kirk

[57] ABSTRACT

An infrared detector and imaging system responsive to the scanned image from an objective lens and scanner system, the infrared detector and imaging system comprising: a detector substrate; a sparsely populated staggered detector array formed on the detector substrate, the detector substrate having a focal plane surface receiving the scanned image from the objective lens and scanner system. A clock means provides clock signals. A control signal means is responsive to the clock signal for providing a sequence of predetermined scanner position signals. A servo responsive to each scanner position signal commands the scanner means to locate the scanned image at predetermined positions on the focal plane. A detector signal integration means receives and integrates an array of detector signals from the sparsely populated detector array. A sampling means samples the amplitudes of each integrated signal from each image and digitizes each integrated signal amplitude to provide an array of digitized integrated detector signal values for each successive scanned image. A digital memory means stores each successive array of digitized integrated detector signal values in corresponding image position memory locations.

32 Claims, 22 Drawing Figures

FIG. 5a
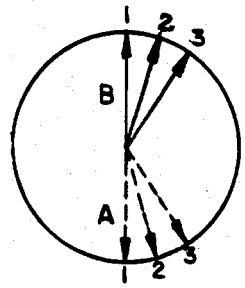
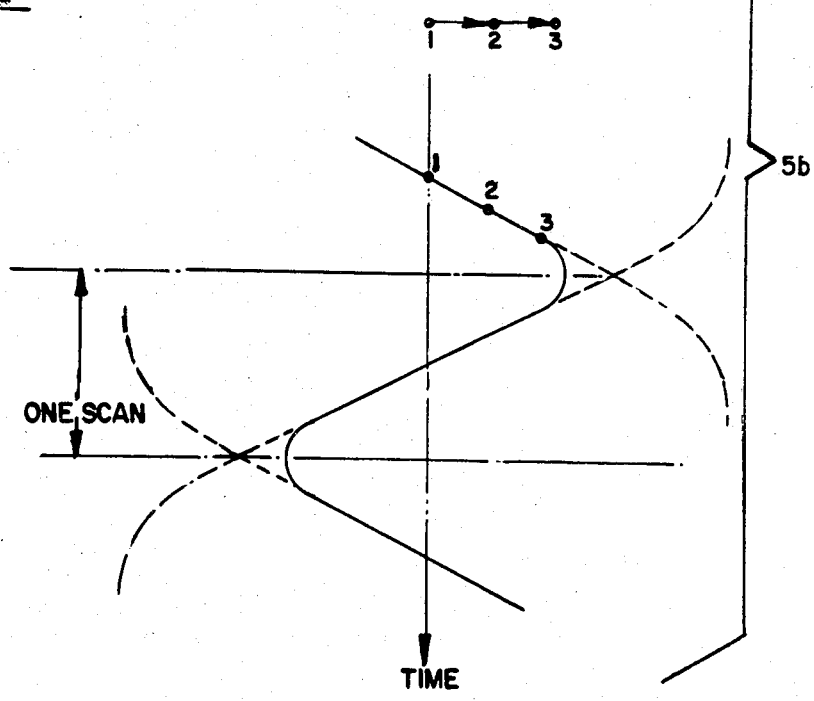
FIG. 5b

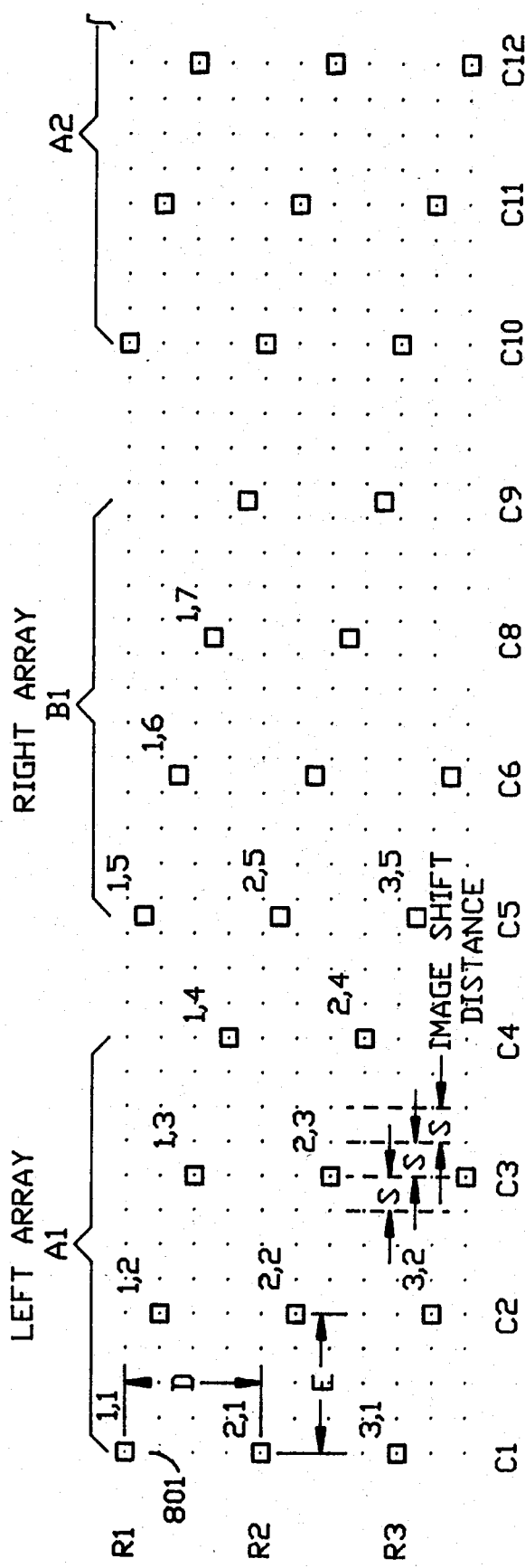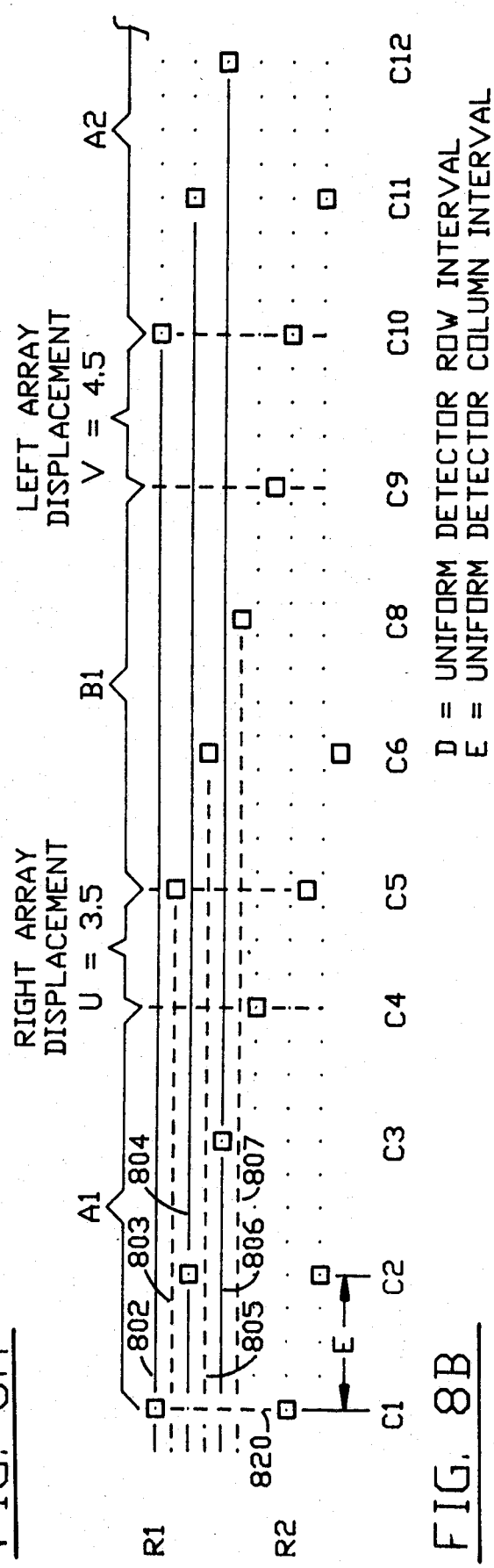
FIG. 8A
FIG. 8B
D = UNIFORM DETECTOR ROW INTERVAL
E = UNIFORM DETECTOR COLUMN INTERVAL

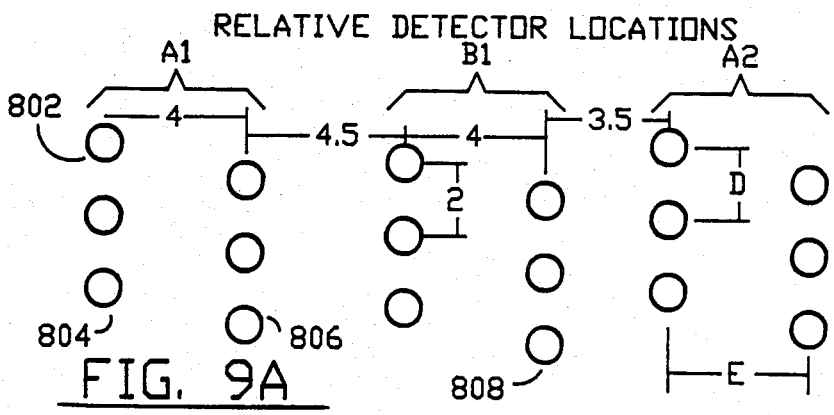
FIG. 9A — RELATIVE DETECTOR LOCATIONS
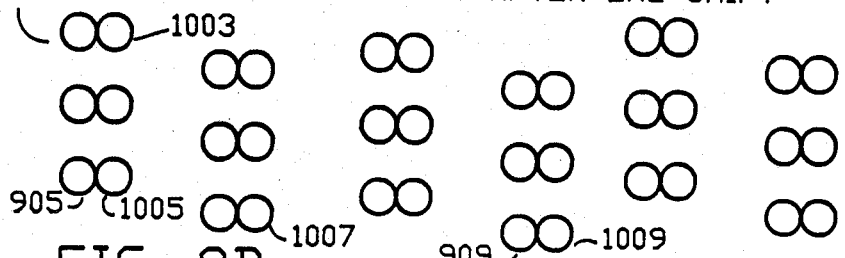
FIG. 9B — MEMORY LOCATIONS AFTER ONE SHIFT
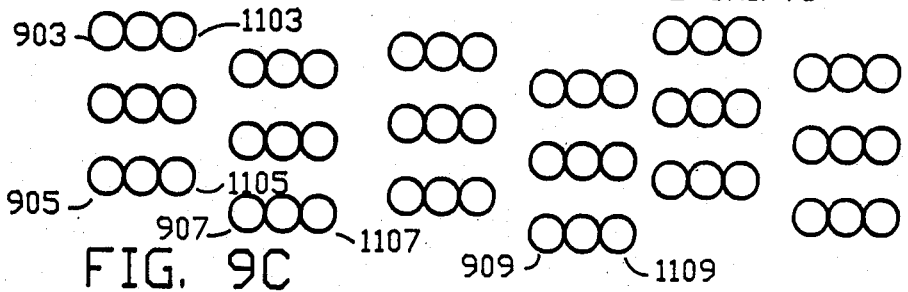
FIG. 9C — MEMORY LOCATIONS AFTER TWO SHIFTS
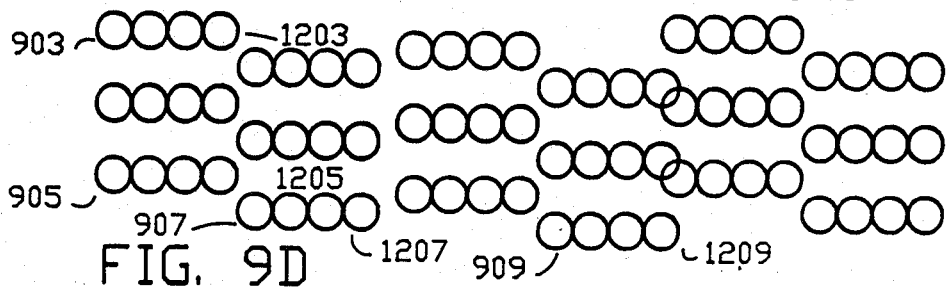
FIG. 9D — MEMORY LOCATIONS AFTER THREE SHIFTS
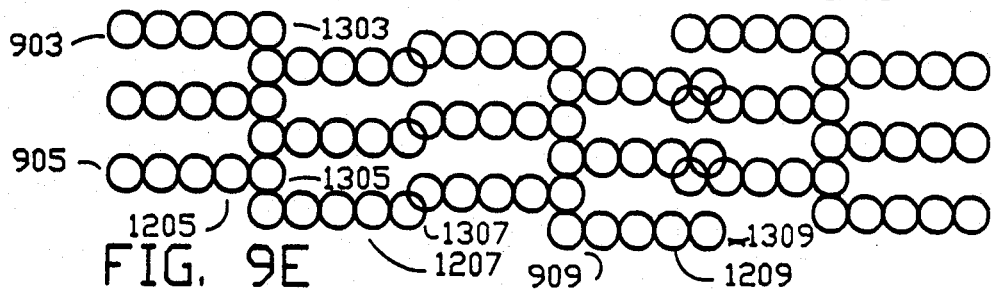
FIG. 9E — MEMORY LOCATIONS AFTER FOUR SHIFTS

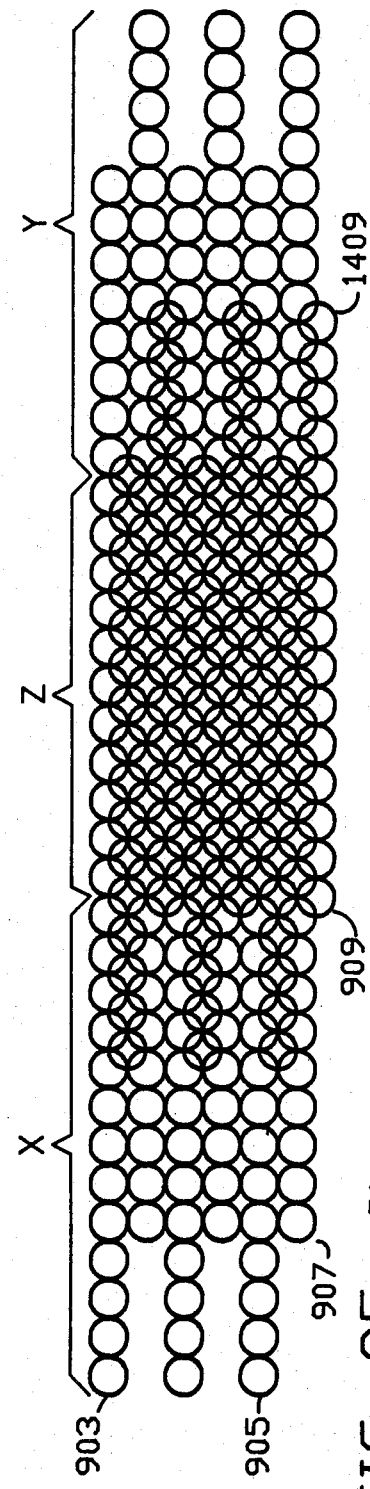
FIG. 9F RELATIVE MEMORY LOCATIONS USED AFTER FIFTEEN SHIFTS
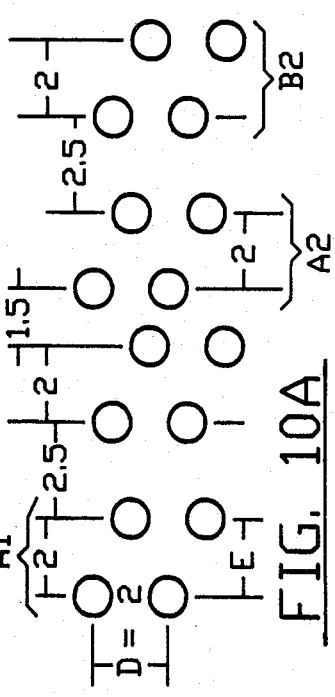
FIG. 10A
FIG. 10B RELATIVE MEMORY LOCATIONS USED AFTER SEVEN SHIFTS USING DETECTOR ARRAY OF FIG. 10A
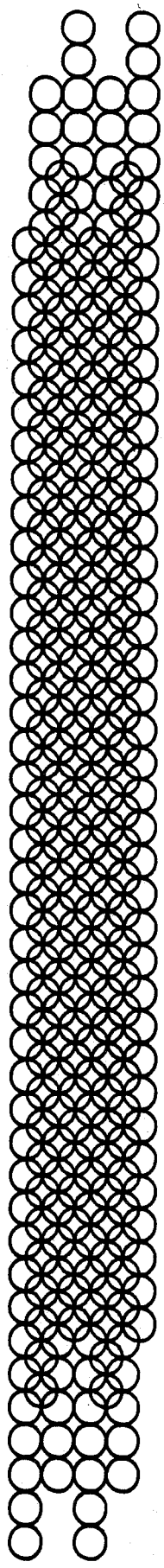
FIG. 11 RELATIVE MEMORY LOCATIONS USED AFTER SEVEN SHIFTS USING DETECTOR ARRAY OF FIG. 10A EXPANDED TO 40 DETECTORS HAVING COLUMNS A1–B5

INFRARED DETECTOR AND IMAGING SYSTEM

BACKGROUND OF THE INVENTION

1. Field of The Invention

This invention relates to the field of multi-element electro-optic imaging systems and more particularly to a technique for increasing the resolution of infrared or thermal imaging system TIS (Thermal Imaging Systems) while preserving response time of the system.

2. Prior Art

Typical infrared or TIS operate by optically moving an image of a scene across a column of detectors.

The response of a TIS is inherently limited by factors such as the number of detector elements present on the focal plane, the integration time, or time required by a detector element to produce a signal faithfully characterizing the intensity of the sensed radiation, the time required to move the image, the separation space required between detectors on the focal plane to be economically manufacturable, and the computational time to process the data from the focal plane.

To increase the response of a TIS, early systems increased the number of elements by using two dimensional focal planes, providing a matrix of multiple detector elements. Each element images a particular portion of a scene. This technique, along with a technique for correcting the response from individual detectors is discussed in U.S. Pat. No. 4,298,887, issued Nov. 3, 1981, titled NON-UNIFORMITY CORRECTION IN A MULTI-ELEMENT DETECTOR ARRAY, by J. P. Rohde, and assigned to the common assignee to this application.

The individual detectors used to form the detector array are typically back biased semiconductor diodes that function as a current or voltage source when exposed to incident light. Detector arrays are typically manufactured with constraints such as the minimum size.

SUMMARY OF THE INVENTION

A principle object of the invention Infrared Detector Array is to provide a TIS having high resolution at low cost by use of a sparsely populated and easily manufactured two dimensional detector array.

It is a further object of the invention to fabricate the detector array on a detector substrate and to teach the fabrication of an array of integration circuits on a separate substrate and to teach a novel means for coupling each detector to a respective integration circuit. The coupling means permits reliably connecting very large numbers of detectors to respective integration circuits within a very small cryogenically cooled area.

High resolution and low costs are realized by the invention of a sparsely populated detector array. The sparseness of the array enhances the manufacturability of the invention by providing a sufficient amount of space on the substrate around each detector. The resolution of the system is then enhanced by using the same detectors to sample a large number of pixels of the scene while incrementally moving the focused image across the focal plane by the use of a scanner. The array of data obtained from each incremental snapshot of the moving image is stored in a digital memory.

The sparse array of detectors is patterned into a novel arrangement of two arrays, the first being referred to as the "A" array and the second, as the "B" array. Each of the two arrays is formed on the same substrate and is arranged to have identical patterns. The "B" array is positioned on the substrate to one side of the "A" array. In addition, rows of the "B" array are vertically displaced to be on lines interposed between lines obtained by extending the centerlines of rows of the "A" array laterally.

BRIEF DESCRIPTION OF THE DRAWINGS

FIGS. 5a and 5b are drawings that relate the lateral motion of a scanned image to the relative angular motion of wedges A and B.

FIG. 8A is a schematic representation of the relative location of detectors in a four column A, B staggered array on four grid unit centers.

FIG. 8B is a schematic representation of a portion of FIG. 8A submitted to show B1 detector array row locations interleaving A1 detector locations, and also showing left and right array displacements.

FIG. 9A is a schematic showing the relative locations of detectors in two column A, B detector array on four grid unit centers, a single step stagger and also showing left and right array displacements.

FIGS. 9B, 9C, 9D and 9E are schematic representations of relative memory locations in which a sequence of image data arrays are stored.

FIG. 9F is a schematic representation of the respective pixel memory location, the full array of circles characterizing the relative memory locations in which detector image information is stored from 16 image data arrays positioned with 15 shifts.

FIG. 10A is a schematic showing the relative locations of detectors in a two column A, B detector array on two grid unit centers, and a single step stagger.

FIG. 10B is a schematic representation of the pixel locations on a video monitor's screen, each circle also corresponding to a respective pixel memory location, the full array of circles characterizing the relative memory locations in which detector image information is stored from 8 image data arrays as the image is scanned across the detector array of FIG. 10A, the arrays being positioned with 7 shifts.

FIG. 11 is a schematic representation of the pixel locations on a video monitor's screen, each circle also representing a corresponding pixel memory location, the full array of circles characterizing the relative memory locations in which detector image information is stored from 8 image data arrays as the image is scanned across the detector array of FIG. 10A, expanded to 40 detectors having columns A1-B5.

DESCRIPTION OF THE PREFERRED EMBODIMENT

Figure 1:
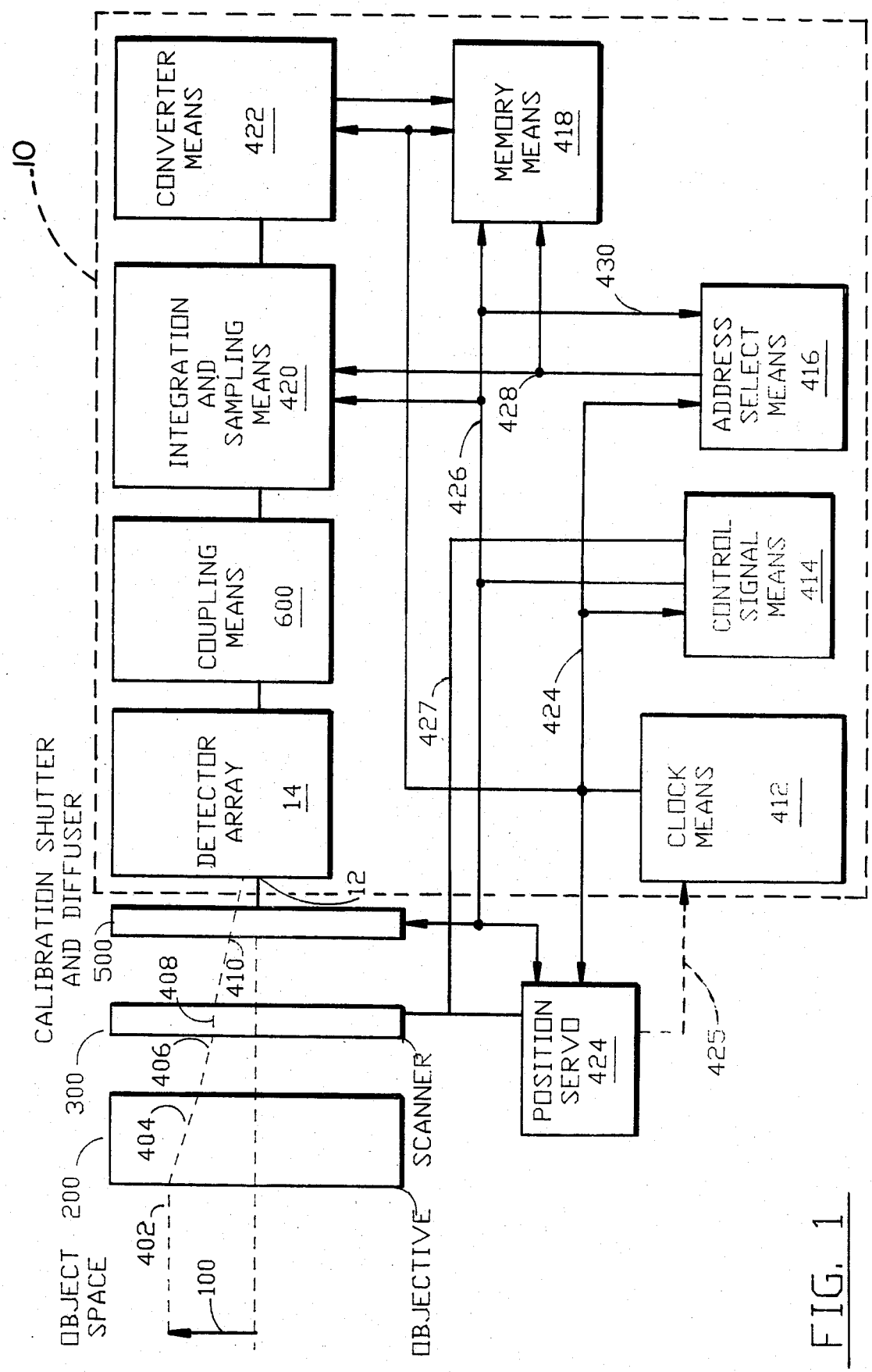
FIG. 1 is a block diagram of the invention system arranged for use in a thermal sight system.
Figure 2:
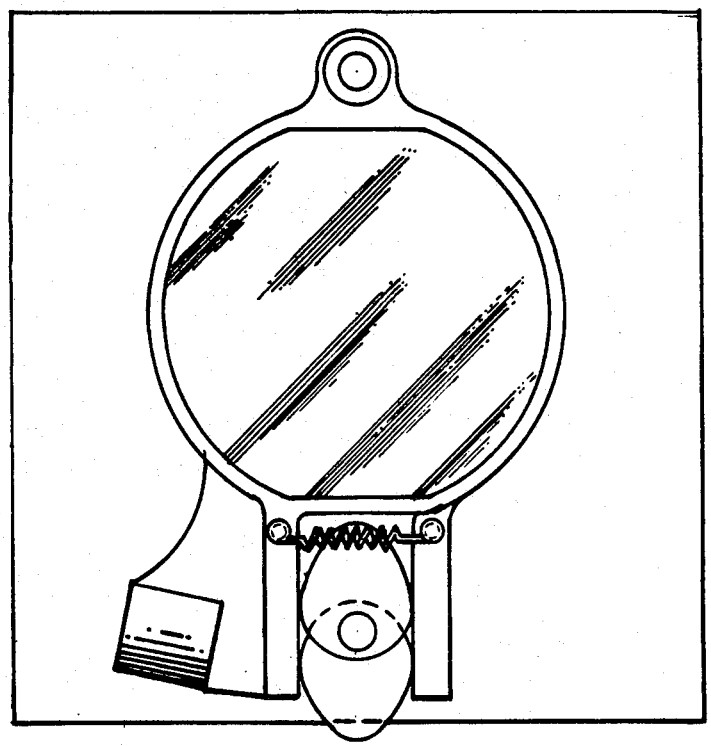
FIG. 2 is a front view of a prior art scanner with scanning wedges centered.
Figure 3:
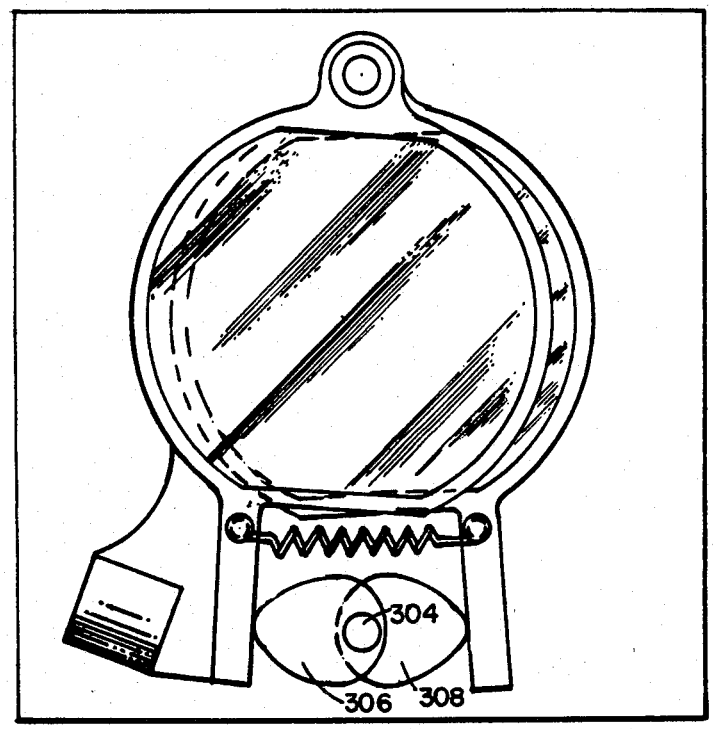
FIG. 3 is a front view of a prior art scanner with scanning wedges displaced by cams.

FIG. 1 shows a block diagram of the infrared detector and imaging system within phantom block 10. The system 10 receives a scanned image (not shown) focused on the flat surface 12 of detector array 14. The scanned image is projected onto surface 12 by scanner 300 and objective lens system 200. The image on the surface of detector array 14 is formed from light reflected from object 100 in object space represented by rays 402 passing to objective 200, passing through objective lens 200 as ray 404, and then passing to scanner 300 as ray 406. Scanner 300 periodically and reciprocally displaces all rays passing through it, such as ray 408 and those leaving it such as ray 410 to form an oscillating focused image of the object 100 on the detector surface 12. Ray 410 passes through a calibration shutter and diffuser 500 interposed between scanner 300 and the surface of detector array 14. Throughout this document the word "light" will be meant to include electromagnetic radiation in the infrared spectrum.

U.S. Pat. No. 4,380,363, issued Apr. 19, 1983 and assigned to the common assignee teaches a Four Element INFRARED OBJECTIVE LENS such as that characterized by block 200. U.S. Pat. No. 4,427,259 issued Jan. 24, 1984 and assigned to the common assignee teaches an alternative objective lens 200, i.e. a SELECTABLE FIELD-OF-VIEW INFRARED LENS having a detachable afocal telescope and a four element reimager objective lens positioned between the scanner and the detector array. It is understood that configurations designed to position the scanner 300 between the objective 200 and the detector surface 12 are functional equivalents to configurations designed to position the objective 200 between the scanner 300 and the detector surface 12. Several equivalent arrangements are possible for placement of the calibration shutter and diffuser 500 in relation to objective 200 scanner 300 and the detector array 14. The particular design objectives of an apparatus using the subject invention will dictate the arrangement selected.

Figure 4:
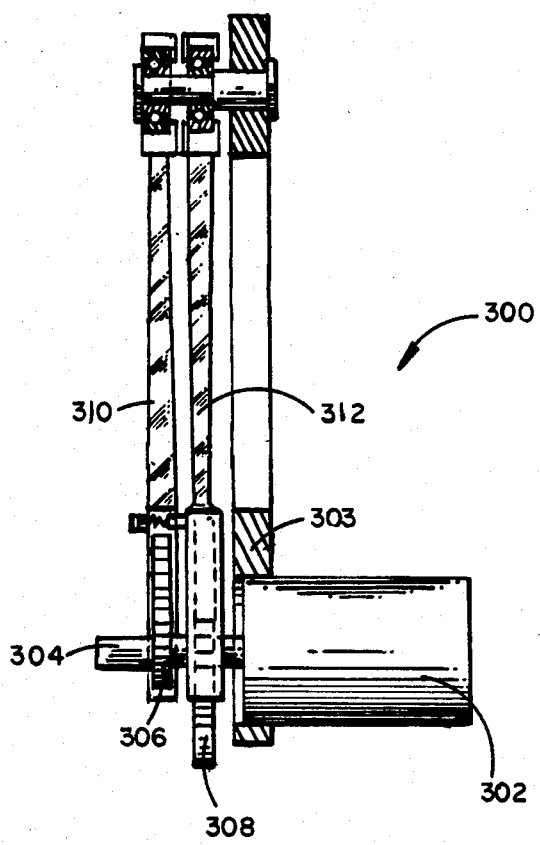
FIG. 4 is a side view of a prior art scanner showing a drive motor and also showing the wedge pivot and bearings in section.

U.S. Pat. No. 4,502,751 dated Mar. 5, 1985 and assigned to the common assignee teach a LINEAR OPTICAL SCANNER functionally equivalent to scanner system represented by block 300. FIGS. 2, 3, 4, 5a, 5b, 6A, and 6B show the scanner described in U.S. Pat. No. 4,502,751 as having two wedge prisms driven by a pair of cams. The two prisms are driven thru a small angle transverse to the optical axis by cam lobes 306, 308. FIG. 4 shows a side view of the scanner 300 with motor 302 being mounted in frame 303. The cam lobes 306, 308 are rotated on motor shaft 304.

FIG. 5a depicts the angular position of counter-rotating prisms A and B at times 1, 2 and 3. FIG. 5b characterizes the lateral displacement of a light ray on the focal plane surface 12 from a center point (1) to position (2) and (3) as the prisms are counter-rotated to concurrent positions (1), (2) and (3).

FIGS. 5a and 5b show the relative deflection of a ray on the focal plane in response to a partial oscillatory oscillation or rotation of the prism pair. The rotation of the A and B prism is restricted to arcs of rotation of opposite sense or polarity having approximate magnitudes of plus and minus 30 degrees respectively. All rays passing thru the scanner are deflected as a bundle thereby deflecting the image on detector array 14.

FIG. 1 shows block 500 representing a shutter-diffuser functional element. This element is functionally necessary for periodically calibrating the detector array. When selected, the shutter-diffuser interrupts the light forming the focused image and provides a diffused and even source of light to all detectors comprising detector array 14. The presence of a uniform source of light simultaneously on all detectors makes it possible to calibrate the detector array by adjusting the bias or reference level for the detector array.

Figure 6:
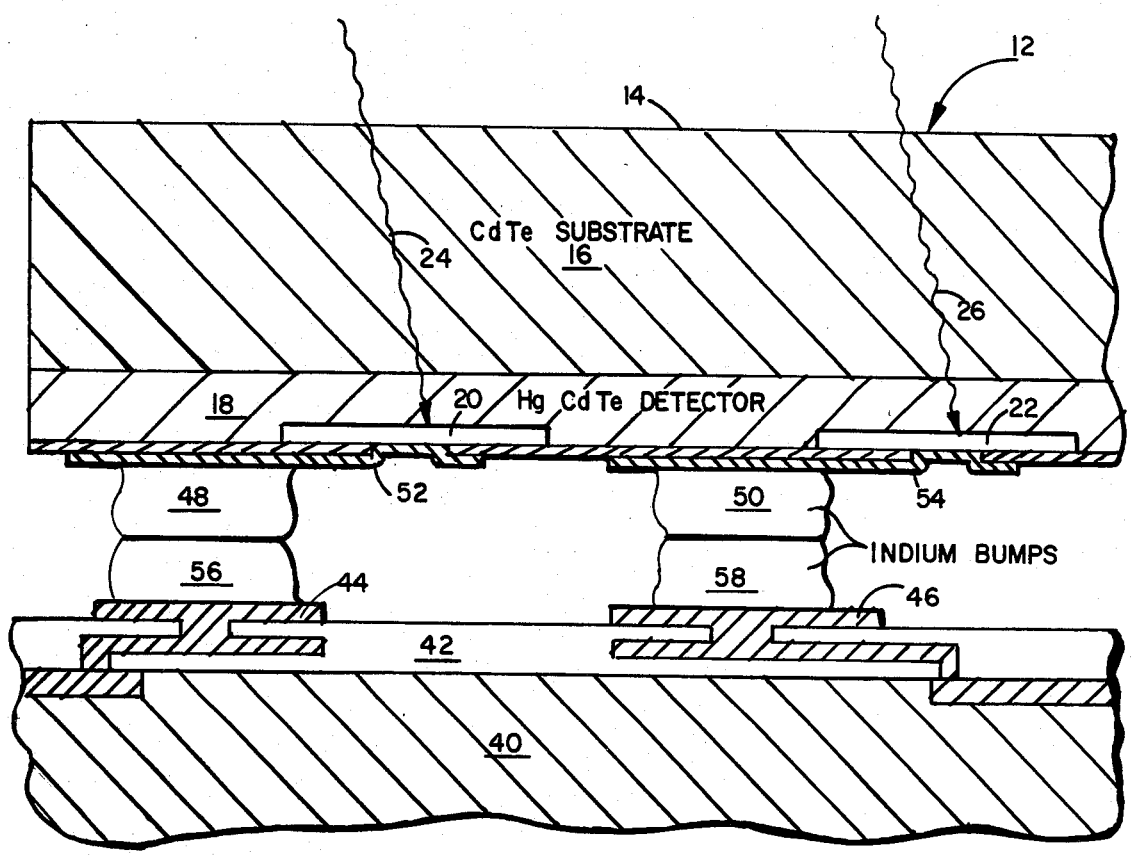
FIG. 6 is a sectional view of the detector and integration cell substrate.

Block 14 represents a detector array assembly containing detector array 14. The detector array 14 is formed on a first substrate. FIG. 6 provides a sectional view of two detectors in diffusion wells 20, 22 in detector array 14 below flat focal plane surface 12 on substrate 16. Substrate 16 is formed of CdTe (Cadmium-Teluride) and is backilluminated. Substrate 16 is transparent to light in the infrared spectrum of interest. The infrared light from object space is focused on flat focal plane surface 12 to form an image, the light then passes through the substrate; as characterized by rays 24, 26, to reach the detectors in wells 20 and 22. The detectors are formed in layer 18 of HgCdTe (Mercury-Cadmium-Teluride) on which a staggered array or pattern of bumps 48, 50 of Indium are deposited on metallurgical contacts 52 and 54. Contacts 52, 54 are electrically coupled to the detectors via metallurgical conductor patterns formed on the detector substrate using photolithography, plating and etching techniques. Contacts 52, 54 respectively, provide a low resistance contact to the cathodes of detectors 20, 22. The anodes of the detectors are electrically common and are electrically coupled via plated or metallurgical paths to an electrical contact similar to those represented by reference numbers 52 and 54.

FIG. 6 also shows integration cell substrate 40 having dielectric layer 42 and metallurgical interconnections 44 and 46. Bumps 56, 58 of indium are formed on electrical contacts 44, 46, respectively, the location of the bumps on the integration cell substrate 40 being positioned to complement the location of the bumps on the base of the detector substrate.

As the substrates are merged or pressed together, the bumps deform as shown in FIG. 6 reliably forming hundreds or even thousands of low resistance electrical contacts, each electrical contact applying a relatively uniform force to the cathode of the detector. Contact pressure influences the detector response, so the use of indium bumps as a coupling means makes it possible to mate large numbers of detectors in a detector array with other electronics without inducing substantial irregularities due to variations in contact pressure near some diodes and not near others.

The detectors 20, 22 in FIG. 6 are intended to represent only two detectors in a sparsely populated array of detectors such as the sparse array of detectors formed in detector substrate 16.

Each detector in each array is located by coordinates that specify the row and column location of the detector center in relation to a reference system such as a pair of optical targets. Each detector has an effective viewing area surrounding its coordinate location or center that is functionally related to the size and sensitivity of the detector.

For the purpose of illustrating the invention sparse array, refer to FIG. 8A. This figure is meant to schematically represent the relative detector locations in relation to the reference detector 801 at location (0, 0).

Table 1 below lists the absolute detector locations of a portion of one embodiment of a detector array measured in inches in "X" and "Y" coordinates. The 0, 0 reference coordinate is at location x=0.000 and y=0.000 at the reference detector.

TABLE 1

| *  | ** | X     | Y     | *  | ** | X      | Y      |
|----|----|-------|-------|----|----|--------|--------|
| A, | (1, 1) | 0.000, | 0.000 | B, | (1, 1) | 0.0155, | 0.0005 |
| A, | (1, 2) | .004,  | .001  | B, | (1, 2) | 0.0195, | 0.0015 |
| A, | (1, 3) | .008,  | .002  | B, | (1, 3) | 0.0235, | 0.0025 |
| A, | (1, 4) | .012,  | .003  | B, | (1, 4) | 0.0175, | 0.0035 |
| A, | (2, 1) | .000,  | .004  | B, | (2, 1) | 0.0155, | 0.0045 |

*Readout Row
**Readout Column

The sparse detector array of FIGS. 8A and 8B contain at least one pair of left and right detector arrays. The embodiment of FIG. 8A shows a left array under the bracket designated as A1 and a right array under the center bracket designated as B1.

Each detector array has at least a first column of detectors spaced horizontally and vertically at uniform unit row intervals (D) on the substrate. The A1 array of FIG. 8A has four columns of detectors designated as columns C1, C2, C3 and C4. The rows of the A1 array are designated as R1, R2, R3 and R4. The columns are shown to be spaced apart at uniform detector column intervals E.

FIG. 8A shows that the number of columns in the A1 (left) detector array is equal to the number of columns in B1 (right) detector array.

FIG. 8B duplicates a portion of the array of FIG. 8A. Phantom lines 803, 805 and 807 are projected from detectors in the B1 array to the vertical reference axis 820 along with solid lines 802, 804, and 806 from detectors in the A1 array to permit FIG. 8B to illustrate that the B1 array (right) column detectors in columns C5, C6, C7 and C8 are vertically positioned at row locations 803, 805, 807 between the rows occupied by said left detector array 802, 804, 806 and 808. The B1 array is horizontally positioned to the right of the A1 (left) detector array at a right array displacement U on the substrate.

FIG. 8B shows the right array displacement U to be three and one-half grid intervals. There are four grid intervals to each unit detector column interval E. Arrays A1 and A2 are successive staggered left detector arrays. The left detector array A2, is horizontally positioned to the right of the preceding right detector array B1 at a left array displacement distance, V, at four and one-half image shift distances FIGS. 8A and 8B are scaled to make lateral image shift intervals equal to the image shift distances.

The FIG. 8A, 8B embodiments are meant to show more particularly that the left array displacement V on the substrate is further characterized to be equal to a first number of image shift distances plus one-half of an image shift distance. The left array displacement V is four and one-half grid units, and the right array displacement U on the substrate is further characterized to be equal to the first number of image shift distances between columns in the left array minus one-half of an image shift distance, i.e., three and one-half grid units.

The "A" (left) array of FIG. 8A, 8B is shown to have detectors in successive columns such as C1, C2, C3, C4 positioned to form a staircase-like pattern. The first detector in each successive column in an A1 array is vertically positioned one uniform unit row or grid unit below the preceding column on the substrate. Each successive B1 (right) detector array column of detectors is also positioned to form a staircase-like pattern. The first detector such as 1,5; 1,6; 1,7 in each B1 array successive column is vertically positioned one grid interval below the preceding column on the substrate.

In an alternative embodiment, of the system of FIG. 1, the scanner system provides a scanner position signal such as a digital encoder signal referencing the image position. In this embodiment, the clock means 412 is responsive to the scanner position signal (via an unshown path). The clock means is synchronized to the motion of the image on the focal plane by position signals from the scanner. In yet another alternative embodiment, the scanner can be fabricated to provide a sequence of predetermined pairs of switch closures to send phase information for scan direction along with a start and limit signal. Between each signal from the scanner, the clock means is characterized to provide the clock pulses required to operate the CONTROL SIGNAL MEANS 414, THE ADDRESS SELECT MEANS 416, THE MEMORY MEANS 418 and the CONVERTER MEANS 422 via signal line 424. The scanner switch closures can be implemented using conventional electromechanical switches, optical encoding, HALL-EFFECT devices or other magnetic or electronic switching means.

In yet another alternative embodiment of the invention of FIG. 1, the scanner 300 is equipped with a scanner position servo 424. The position servo in this alternative embodiment is fabricated to continuously drive the scanner to position the image on the detector array to a sequence of predetermined positions, each of the predetermined positions corresponding to a position signal from the CONTROL SIGNAL MEANS 414. One alternative embodiment includes a ROM in the CLOCK MEANS 412 or in the CONTROL SIGNAL MEANS 414 programmed to provide a recurrent series of image position locations to the POSITION SERVO 424 via signal bus 426.

The CONTROL SIGNAL MEANS 414 of FIG. 1 is responsive to the clock signal on bus 424 and to each scanner position signal for providing a sequence of array address signals for MEMORY MEANS 418. Each address signal within each array designates a memory location in which to store a digital value characterizing the amplitude of the integrated signal from a respective detector.

Each image array of data, when stored, is retrievable to form a sparse video image.

FIG. 9A is a schematic representation of a two column, one step A, B array having detector elements spaced four grid units apart. For the purpose of illustrating the invention, detectors 802, 804, 806 and 808 are referenced. Each grid unit represents an image shift distance. The array is shown having 18 detectors in an A1, B1 and A2 array.

At the first image position, the eighteen detectors provide eighteen (18) signals via the COUPLING MEANS 600 (bumps) shown in FIG. 1 to eighteen integration cells on the integration substrate. In response to signals from CLOCK MEANS 412 and CONTROL MEANS 414 and under control of ADDRESS SELECT MEANS 416, each of the eighteen integrated signals are coupled to CONVERTER MEANS 422 for conversion to digital values, the resulting eighteen digitized values being then stored in respective locations in the MEMORY SELECT MEANS 418.

FIGS. 9B, 9C, 9D schematically represent the memory locations of successive image data arrays on a memory map. FIG. 9B represents a map of the first array of memory locations 903, 905, 907, 909 in which the digitized integrated detector values from detectors 802, 804 and 806 and 808 are stored. FIG. 9B characterizes a second array of adjacent memory locations 1003, 1005, 1007 and 1009 adjacent to respective locations 903, 905, 907 909. These relative data locations are filled with data from the second image data array subsequent to a first shift of the image through a lateral image shift distance on the focal plane and subsequent to a second integration interval. FIG. 9C maps additional memory locations 1103, 1105, 1107 and 1109, each containing the digitized integrated value from a respective detectors 902, 904, 906, 908 obtained subsequent to a second shift of the image through a lateral image shift distance on the focal plane and subsequent to a third integration interval. FIG. 9D is a map of the data stored subsequent to the third shift into locations 1203, 1205, 1207, 1209 and FIG. 9E is a maps the data into locations 1303, 1305, 1307, 1309 after a fourth image shift. FIG. 9F is a map of the relative memory locations containing data for 16 image positions resulting from 15 successive image shift distances on the focal plane.

The image data in cells 903 and 1003 originated from the same detector 902 reading adjacent images. As the data in these locations is row scanned, left to right or right to left, converted back to an analog signal, this analog signal being used to modulate a video beam moving from left to right on the screen, the beam will duplicate the image intensity at the two adjacent locations. The image array data in the memory map of FIG. 9D, if row scanned and converted, provides a video image of higher resolution.

The map of FIG. 9F provides image data at the center region designated by bracket Z having double row and double column density after fifteen image shifts. The video image resulting from row scanning the Z bracketed data provides a video image having a resolution of twice that obtainable from a detector array in which the detectors represented by circles, such as those in FIG. 9A, were to be placed side by side, their circular edges being in contact with laterally adjacent detectors and with those above and below.

Referring to FIG. 9F, the data in the map represented by brackets X and Y is referred to as scalloped data. This data is not used in producing a uniform high resolution video image.

FIG. 10A shows another alternative two column A, B staircase detector array. The detectors are positioned on uniform detector row spacing D and on non-uniform column E intervals as indicated. FIG. 10B shows the map of data array storage locations required in memory for eight image snapshots using the detector array of FIG. 10A with seven image shifts through lateral image shift distances.

FIG. 11 shows the memory map of data resulting from 7 image shifts through lateral image shift distances using the detector array of FIG. 10A expanded to 40 detectors having columns A1, B1 through A5, B5.

From the examples of FIGS. 9 and 10, it is apparent that increasing the grid spacing between detectors results in an increase in the number of image shifts that must be performed to maintain the same resolution. It is also clear, from these examples, that the resolution of the video image obtainable from a given detector density or spacing is enhanced far beyond that obtainable from a conventional staring system.

Referring again to FIG. 10B, as the image is shifted for the seventh time on the focal plane the image pixel sensed by the upper left detector of the A1 column in the eighth data array is contiguous (i.e., adjacent) with the data taken by the upper left detector of the A2 column taken with the first data array before the first incremental image shift. If scanning continues after the seventh incremental shift and an additional shift in the same direction is taken, the data taken via the upper left detector in the A1 column and its associated electronics will overlay and obscure the data taken by the upper left detector in the A2 column stored at the time the first array of data was taken.

It is clear from this example, that care must be taken to coordinate the detector size, in-scan-direction spacing (FIGS. 9-11 show horizontal scan examples) and the number of image shifts per scan to obviate image gaps or data obliteration. The distance through which the image moves on the focal plan is a function of the scan angle controlled by the scanner and the objective lens system. Each incremental scan moves the image on the focal plane through an incremental shift distance equal to the effective width or size of the detector. The number of lateral incremental shifts required for a complete scan in one direction will, therefore, be equal to one less than the number of effective detector widths between adjacent corresponding A columns. For example, referring to FIG. 10A, eight effective detector widths are shown between columns A1 and A2. Observe that the indicated spacings are 2+2.5+2+1.5 and the sum equals eight.

Figure 13:
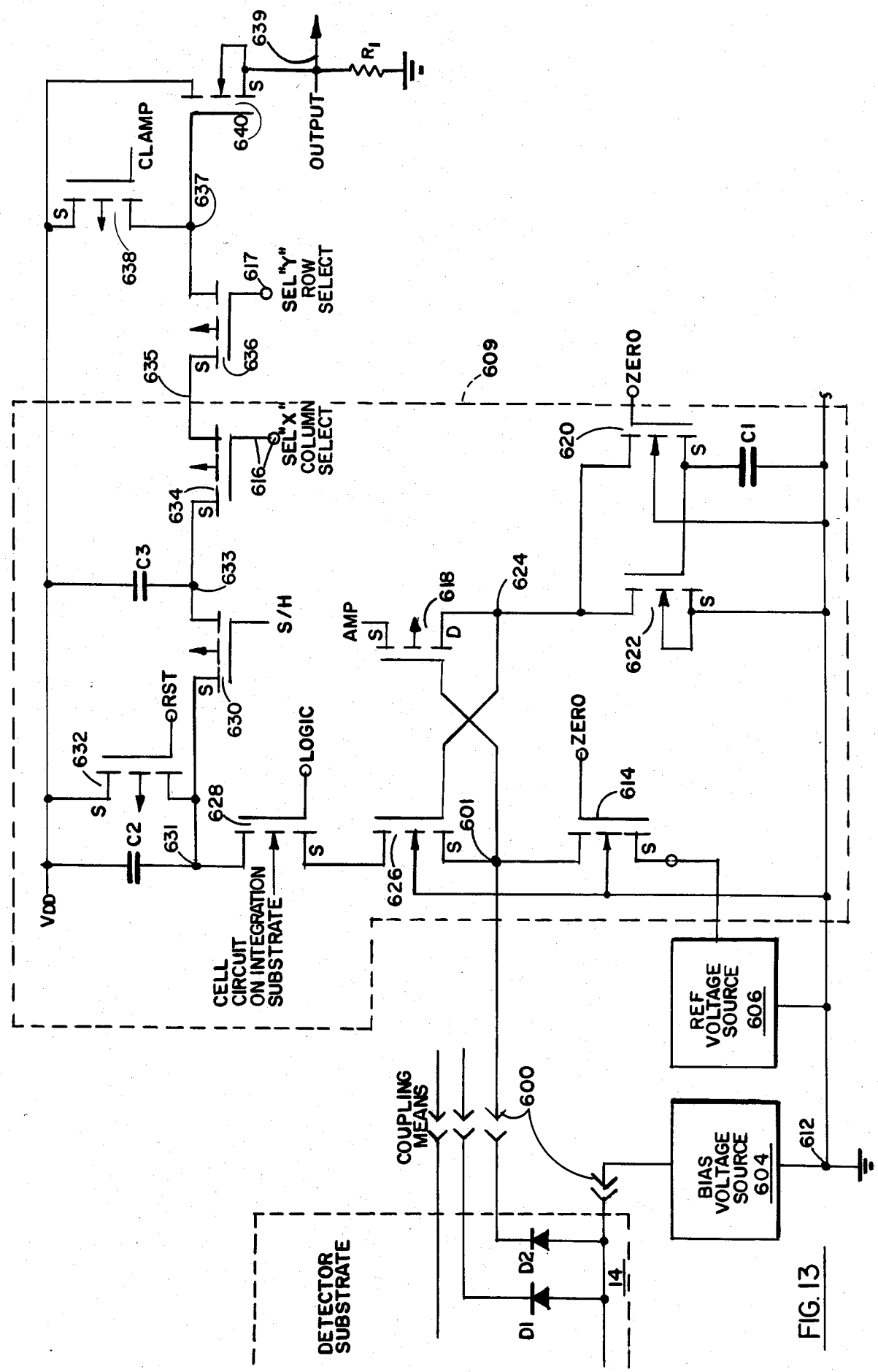
FIG. 13 is a schematic of an integration cell circuit.

FIG. 13 is a schematic of a single cell circuit capable of functioning in an array as a detector signal integration means 420 for receiving, and integrating an array of detector signals from the sparsely populated detector array 14.

Figure 7:
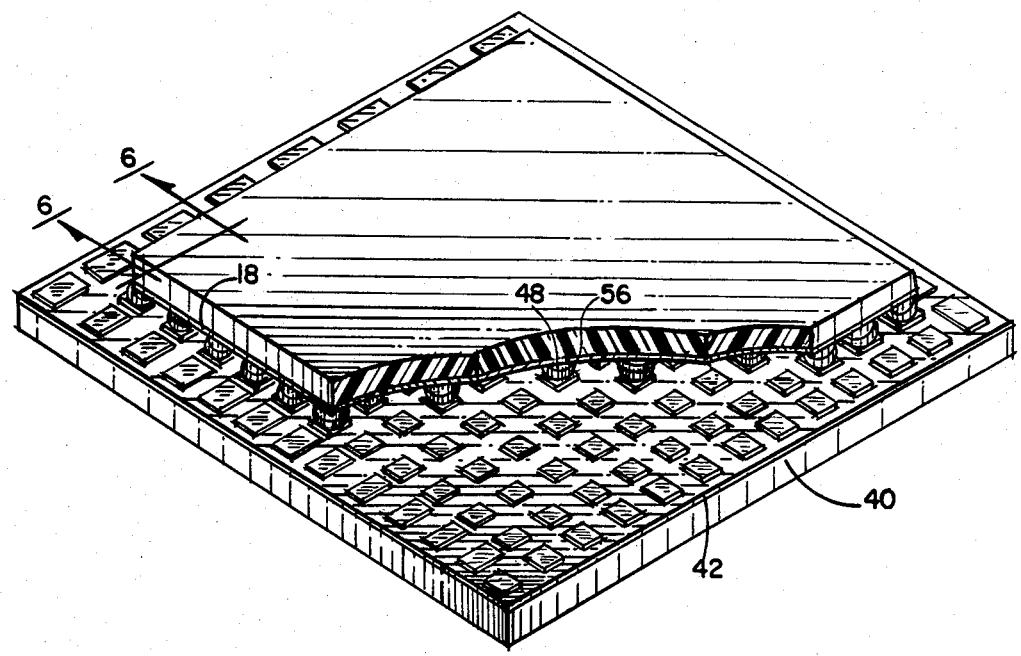
FIG. 7 is a perspective view of an assembly showing the detector substrate in partial cut-away mounted via indium bumps to the multiplexer cell substrate.

Operation of the circuit of FIG. 13 will be explained in accordance with the timing chart of FIG. 14. In response to infrared light rays, such as ray 410, detector D2 responds as a current source sourcing electrons onto integration cell circuit input node 601. The electrons are coupled via coupling means 600, comprising indium "bumps", shown in FIGS. 1, 6, 7 and discussed supra. The detector anode is coupled to a BIAS voltage source 604 referenced to reference node 612.

ZERO INTERVAL REF. VOLTAGE SOURCE 606 is sampled periodically by each integration cell circuit, such as is shown within phantom border line 609. The REF VOLTAGE SOURCE 606 is adjusted to provide a reference voltage level to the source of FET 614. The gate of FET 614 is coupled to receive logic signal ZERO (not shown). The logic signal ZERO is made available typically as the scanner 300 reverses direction or at other non-viewing times. As the ZERO logic signal goes positive, FET 614 turns on coupling reference voltage source 606 to INPUT node 601. During the ZERO logic interval, the REF VOLTAGE SOURCE 606 controls the voltage at INPUT node 600. The gate of FET 618 is coupled to INPUT node 601 and is controlled by REF VOLTAGE SOURCE 606 during the ZERO interval.

As the ZERO interval commences, FET 618 turns on. The gate of FET 620 is coupled to the ZERO logic level, so FET 620 is turned on also by the ZERO logic signal concurrent with FET 614 applying the REF voltage source to the gate of P-Channel Enhancement Mode FET 618. FET 620 couples the drain of FET 618 to capacitor C1. Capacitor C1 charges up positively in response to current from the conduction channel of FET 618 passing through FET 620 to capacitor C1.

FET 622 has its gate coupled to C1. As C1 charges, FET 622 begins to turn-on. The current through FET 622 increases until it is approximately equal to the current through FET 618 into C1 after which the ZERO logic level goes low turning FETs 614 and 620 OFF.

INTEGRATION INTERVAL

Subsequent to the ZERO interval, diode D2 provides a negative shift in potential to the gate of P-Channel FET 618 driving this FET into conduction. Current through FET 618 raises the potential on node 624 and the gate of FET 626. FET 626 is driven into conduction by FET 618 in response to detector D2 raising the voltage at input Node 600 by only a few milli-volts. The circuit of FETS 618, 622 and 626 therefore operates as a fast, high gain amplifier driving a current injunction FET for coupling the input of detector D2 to the integration capacitor C2.

FET 628 is continuously on in response to LOGIC applied to the gate of FET 628. Electrons flow from detector diode D2 through the conduction channels of FETs 626 and 628 to C2 and drive the voltage on node 631 in a negative direction during intervals other than RST (reset). Capacitor C2 is shorted or reset by P-Channel Enhancement FET 632 during the RST interval characterized by waveform RST in FIG. 14. The integration interval is represented by the interval between the second waveform negative pulse of RST and the following positive S/H interval.

SNAPSHOT OPERATION

A sample and hold circuit is used to permit the detectors to maximize the integration time. The integration time is made as long as possible because a maximum detector drive current is typically in the range of 7 nano amperes.

The snapshot function starts by discharging the C3 capacitor to VDD by simultaneously turning on FETS 634, 636 and 638. This conduction path is then opened. At the end of the integration interval FET 630 is turned on connecting C2 to C3 by logic level S/H, the first waveform in FIG. 14. FET 630 then opens up leaving C3 charged to a voltage proportional to but less than the original voltage on C2. C3 serves as the storage device in a sample and hold circuit. The signal is held on C3 until the system accesses it by simultaneously turning on address select FETs 634 and 636.

FET 640 operates as a source follower and provides an output signal at output node 639 via R1, the output signal being less than but proportional to the original integrated signal value on C2 at node 631.

ADDRESS CIRCUIT

The gates of FETs 634 and 636 are referenced as nodes SEL"X" 616 and SEL"Y" 617 respectively. Large numbers of detectors are used in the detector arrays, and each detector uses an integration cell circuit such as that shown in FIG. 13.

Figure 12:
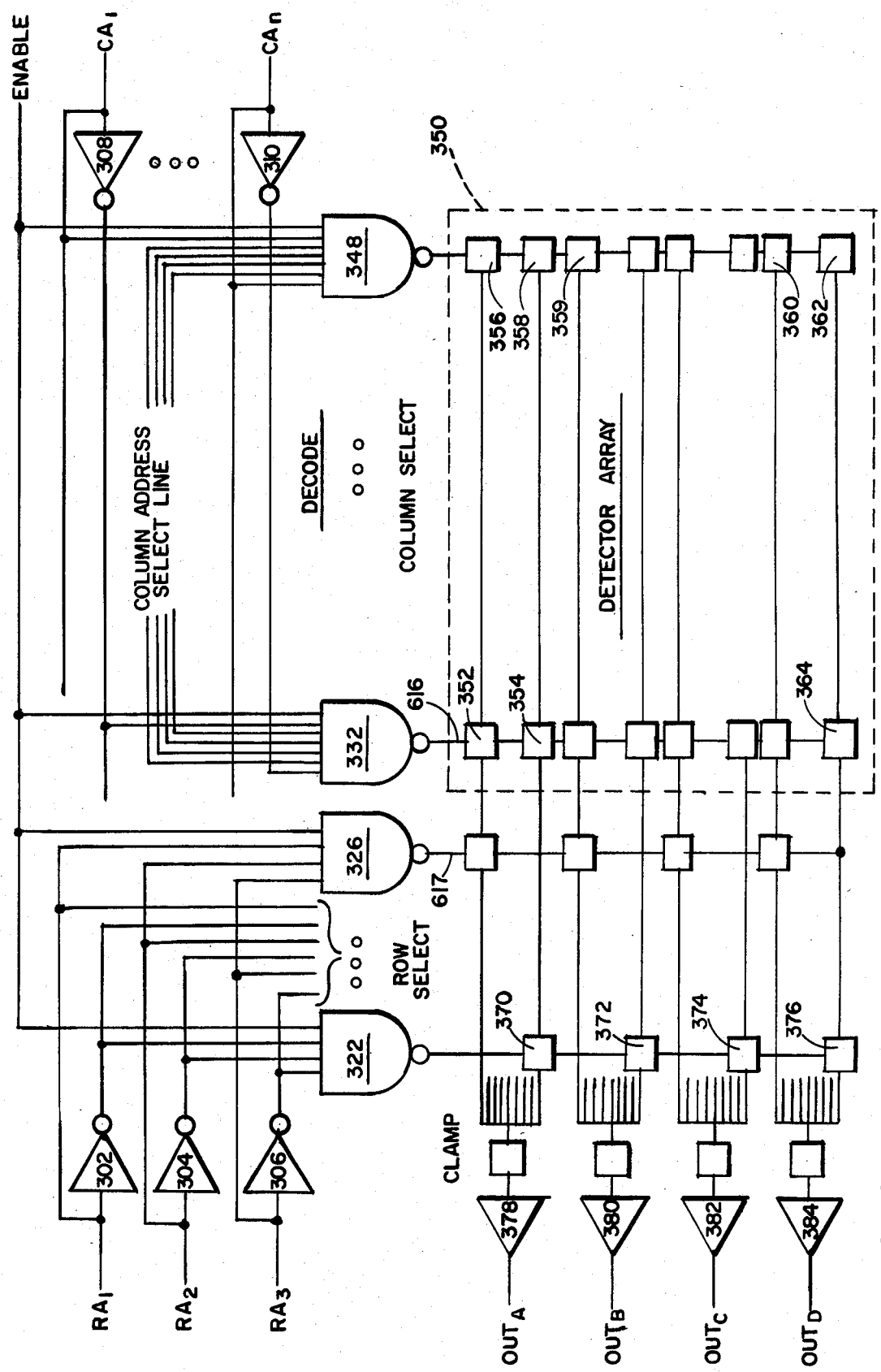
FIG. 12 is a schematic representation of the logic circuit organization used for addressing respective integration cells.

The logic circuit of FIG. 12 represents an embodiment of a portion of a control signal means such as that represented by block 414 and 416 in FIG. 1 and in particular, a portion of the ADDRESS SELECT MEANS block 416. The CONTROL SIGNAL MEANS 414 is responsive to the clock signal on line 424 and to each scanner position signal on 427 for providing a sequence of array address signals, each address signal within each array designating a memory location in which to store a digital value characterizing the amplitude of the integrated signal, such as the voltage at node 631 at sample time designated by S/H in FIG. 14, from a respective detector. These address signals are also provided to (ROW ADDRESS) lines RA1, RA2, and to lines CA1, CA2—column address lines. The row and column address are signals typically sourced by a control signal means 426 such as a microprocessor operating from a pre-stored program or sequencer such as a counter, counter driven ROM, or gate array driven by the CLOCK MEANS 412. The row and column address signals are received by buffer inverters 302, 304, 306, 308, 310 and are then fed to row address decoder 322–325 and column address decoders 332–348 respectively. The outputs of nand gates 332–348 are fed to column select "X" lines in DETECTOR ARRAY phantom block 350. Integration cell circuits on ARRAY 350 are represented by boxes 352, 354–356, 358–360, 362 respectively. All cells on a column line are column selected by the output of a single decoder NAND gate. Thus, as the six lines of NAND gate 332 go high, its output would go low selecting all cells on that column select line such as 352, 354–364.

The row select NAND gates each select 4 of the column select outputs. Thus, NAND gate 322 simultaneously closes SEL "Y" switches 370, 372, 374 and 376.

A concurrence of SEL "X" and SEL "Y" switches occurs at switch 370 and 354 or at 370 and 358 depending on whether the output of NAND GATE 332 or 348 is low.

The circuit of FIG. 12 simultaneously couples four sampled outputs to outputs OUTA, OUTB, OUTC and OUTD. Buffers 378, 380, 382 and 384 are equivalents to N-Channel Enhancement mode FET 640 shown in FIG. 13 and discussed supra.

Figure 14:
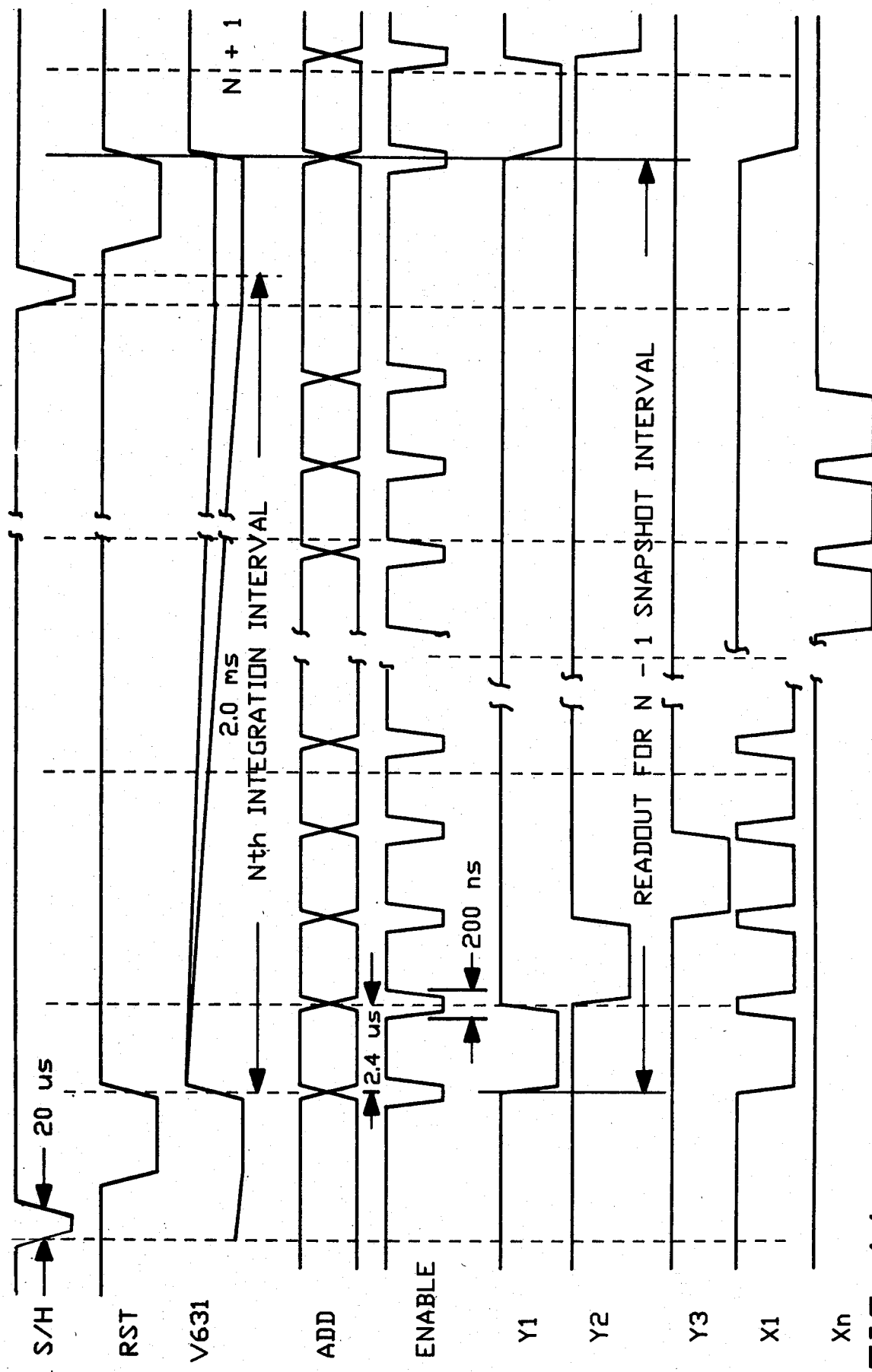
FIG. 14 is a sequence diagram showing relative timing relationships.

FIG. 14 is an expanded timing diagram that schematically shows the relationship between logic signals occurring during one integration interval and the start of a subsequent integration interval. One integration interval is required for each "snapshot". Each "snapshot" provides a data array of elements, for storage in the memory means, having as many elements as there are detectors with respective integration cells. It is also apparent that the invention provides a structure that can be butted alongside adjacent arrays to multiply the number of available detectors for each snapshot.

As the S/H (Sample-and-Hold) logic term goes low on the first waveform of FIG. 14, P-Channel FET 630 is driven into conduction transferring the integrated charge on C2 to C3 storing the sampled voltage on C3 at node 633. As S/H goes high, FET 630 opens. A small time interval is provided before RST goes low turning on FET 632 and discharging C2. This time interval insures that FET 630 is off, isolating the charge on C3, before FET 632 is turned on to discharge C2.

The Nth integration interval starts as the RST Logic term goes high.

The third waveform in FIG. 14 titled V631 represents the voltage at node 631. The voltage decreases with time over the integration interval in response to electron flow from the detector D2 in FIG. 13 sourcing electrons through FETs 626 and 628.

As the integration interval progresses, address counters provide row and column address terms in a predetermined sequence such as the RA1, RA2, RA3 and CA1-CAn terms shown on FIG. 12. These terms are represented by the fourth waveform ADD in FIG. 14. The ADD term ends when the row and column terms reach their maximum counts.

The sixth, seventh and eighth waveforms of FIG. 14 are meant to describe the logic terms appearing on the outputs of gates 322-326 in FIG. 12. The row terms repeat for each of the column select X1-Xn terms characterized by the ninth and tenth waveforms of FIG. 14. The column terms represent logic terms appearing at the output of column select gates 332-348 shown in FIG. 12. The fifth waveform of FIG. 14 is the ENABLE logic term used in the decoder circuit of FIG. 12. The ENABLE term permits all row and column select lines to complete their transition before a cell is selected.

At the conclusion of the Nth integration interval of FIG. 14, there is a short delay interval followed by another S/H and RST term. As the second RST term goes high, the readout process restarts for the Nth Integration interval as the N+1 Integration Interval starts. The contents of all cells are transferred to the CONVERTER MEANS 422 of FIG. 1 by the DECODER of FIG. 12 in groups of four cells at a time. A detector substrate having sixteen detectors will require four readout cycles while a detector substrate with 32 detectors will require eight readout cycles.

The ADDRESS SELECT MEANS 416 of FIG. 1 is meant to represent conventional combinational logic, such as that obtainable via gate arrays or via software in response to sequential control signals from CONTROL MEANS 414 and tailored to achieve the required mapping of each array of data from each snapshot into predetermined locations in the MEMORY MEANS 418 from which the data is continuously extracted to provide information such as a video display. The mapping function to be realized will be dependent on the number of detectors in each detector substrate, the number of detector substrates, the number of image shift distances through which the image is shifted for each scanner scan, the size of the MEMORY MEANS 418 and the sequence in which the information is to be extracted from the MEMORY MEANS. The CONVERTER MEANS 422 is typically a conventional flash converter using an array of high speed comparators, each comparator (not shown) sensing a larger portion of a voltage such as that from the OUTA, OUTB, OUTC or OUTD terms of FIG. 12. The comparators are each referenced to a precision reference and the inputs are typically coupled to a precision ladder network.

What is claimed is:

1. An infrared detector and imaging system responsive to the scanned image from an objective lens and scanner system, the infrared detector and imaging system comprising:
    a detector substrate,
    a sparsely populated staggered detector array formed on the detector substrate, the detector substrate having a focal plane surface positioned to receive said scanned image from said objective lens and scanner system, each detector in the array being responsive to incident light for providing a signal having an amplitude proportional to the intensity of the incident light received by the detector;
    clock means for providing a sequence of clock signals;
    a control signal means responsive to the clock signal providing a sequence of predetermined scanner position signals, each predetermined scanner position signal corresponding to a predetermined scanned image position and for providing a sequence of array address signals, each address signal within each array corresponding to a predetermined detector in the detector array for each image position;
    means responsive to each scanner position signal for commanding the scanner means to locate the scanned image at predetermined positions on the focal plane, each successive image position being shifted an image shift distance;
    a detector signal integration means for receiving, and integrating an array of detector signals from the sparsely populated detector array;
    coupling means for electrically coupling the detector signal from each detector in the detector array to a corresponding detector signal integration means input, the detector signal integration means providing an integrated output signal for each detector signal from each detector in the sparsely populated detector array;
    sampling means responsive to the clock signal and to the sequential control signals for sampling the amplitudes of each integrated signal from each image and for digitizing each integrated signal amplitude to provide an array of digitized integrated detector signal values for each successive scanned image;
    a digital memory means responsive to the clock signal and the sequential control signals and having a plurality of predetermined arrays of digital memory locations, each array of digital memory locations corresponding to a scanned image position for storing each successive array of digitized integrated detector signal values into a corresponding image position array of memory locations.

2. The infrared detector and imaging system of claim 1 wherein said integration and sampling means further comprises;
    an array of integration cell circuits, each integration cell circuit being characterized to receive and integrate a corresponding detector signal.

3. The infrared detector and imaging system of claim 2 wherein each integration cell circuit is formed on an integration cell substrate.

4. The infrared detector and imaging system of claim 1 wherein each detector in the detector array on the detector substrate has a first and second electrode;
    said sparsely populated detector array detectors each being formed on the surface of the detector substrate opposite the focal plane, the opposite surface having a predetermined pattern of metallurgical conductors patterned to provide a predetermined array of electrical contact pads, each pad being electrically coupled to a respective detector first electrode, all second electrodes being electrically common and electrically coupled to a detector array reference terminal on said detector substrate, and wherein;
    the integration and sampling means has an array of integration cell circuits, each integration cell circuit being characterized to receive and integrate a corresponding detector signal, the integration cell circuits being formed on an integration cell substrate, each integrated cell circuits within the array of integration cell circuits being formed on the receiving surface of said integration cell substrate and characterized to receive a corresponding detector signal at a respective integrated cell input pad and to integrate said detector signal; said sparsely populated detector array detector substrate predetermined pattern of metallurgical conductors being patterned to provide a predetermined array of electrical contact pads said pads being patterned to be at locations complementary to respective integration cell circuit input pad locations on the surface of said integration cell substrate when the respective surfaces are positioned and registered in opposing and stacked parallel plane relation;

said coupling means being further characterized to couple each detector first electrode to a respective integration cell substrate integration cell circuit input pad, the detector array reference terminal on said detector substrate being electrically coupled to an integration cell substrate reference terminal.

5. The infrared detector and imaging system of claim 4 wherein said coupling means for electrically coupling the detector signal from each detector in the detector array to a corresponding detector signal integration means input further comprises an arrangement wherein:

a layer of indium is applied to each electrical contact pad on the detector substrate detector surface to form indium bumps, each bump being of uniform thickness, and wherein a layer of indium is applied to each electrical contact pad to form indium bumps of uniform thickness on each integration substrate integrated cell input, the bumps on opposing electrical pad surfaces being positioned in complementary registration, the bumps on opposing electrical pad surfaces merging to form a low resistance electrical contact between respective opposing electrical pads in response to the detector surface of the detector substrate being pressed against the receiving surface of the integration substrate.

6. The infrared detector and imaging system of claim 1 wherein said sparsely populated staggered detector array further comprises:

at least one pair of left and right detector arrays, each left detector array having at least a first column of detectors spaced vertically at uniform detector row intervals on said substrate, and each right detector array having at least a first column of detectors spaced vertically at said uniform detector row intervals on said substrate, the number of columns in each left detector array being equal to the number of columns in each right detector array, said right column detectors being vertically positioned on row locations between the rows occupied by said left detector array, each successive right detector array being horizontally positioned to the right of said left detector array at a right array displacement on said substrate.

7. The infrared detector and imaging system of claim 6 wherein said staggered detector array further comprises:

at least two pairs of left and right detector arrays, each successive left detector array being horizontally positioned to the right of each preceding right detector array at a left array displacement on said substrate.

8. The infrared detector and imaging system of claim 7 wherein:

each said left array displacement on said substrate is further characterized to be equal to said predetermined number of image shift distances plus one-half an image shift distance, and each said right array displacement on said substrate is further characterized to be equal to said predetermined number of image shift distances minus one-half an image shift distance.

9. The infrared detector and imaging system of claim 6 wherein:

each said left detector array has at least two columns of detectors each column of detectors being spaced laterally at uniform detector column intervals on said substrate, and each right detector array having at least two columns of detectors, each detector in each column being spaced laterally at uniform detector column intervals on said substrate;

said right array column detectors being vertically positioned on rows interposed and vertically equidistant from the rows of said left array detector array;

each successive right detector array being horizontally positioned to the right of said left detector array at a right array displacement on said substrate.

10. The infrared detector and imaging system of claim 9 wherein:

each successive left detector array column of detectors is positioned to form a staircase-like pattern, the first detector in each successive column being vertically positioned one uniform unit row interval below the preceding column on said substrate, and each successive right detector array column of detectors is positioned to form a staircase-like pattern, the first detector in each successive column being vertically positioned one uniform unit row interval below the preceding column on said substrate.

11. The infrared detector and imaging system of claim 10 wherein:

said right array displacement separating each successive right detector array to the right of a preceding left detector array is further characterized to be equal to the predetermined number of image shift distances minus one-half an image shift distance, and each said left array displacement separating each successive left detector array to the right of a preceding right detector array is further characterized to be equal to the predetermined number of image shift distances plus one-half an image shift distance.

12. The infrared detector system of claim 1 wherein:

said scanner system provides a scanner position signal, and said clock means is responsive to said scanner position signal.

13. The infrared detector system of claim 1 wherein said scanner system further comprises:

a position servo means for continuously driving said scanner to position said image on said detector array to a sequence of predetermined positions, each predetermined position corresponding to said clock signal.

14. An infrared detector and imaging system responsive to the scanned image from an objective lens and scanner system, the infrared detector and imaging system comprising;

a detector substrate, a sparsely populated staggered detector array formed on the detector substrate, the detector substrate having a focal plane surface positioned to receive said scanned image from said objective lens and scanner system, each detector in the array being responsive to incident light for providing a signal having an amplitude proportional to the intensity of the incident light received by the detector;

clock means for providing a sequence of clock signals;

scanner position signal means for providing a scanner position signal characterizing the image position on the focal plane;

a control signal means responsive to the clock signal and to each scanner position signal for providing a sequence of array address signals, each address signal within each array designating a memory location in which to store a digital value characterizing the amplitude of the integrated signal from a respective detector;

an integration and sampling means for receiving, and integrating an array of detector signals from the sparsely populated detector array;

coupling means for electrically coupling the detector signal from each detector in the detector array to a corresponding integration cell circuit input, the integration and sampling means providing an integrated output signal for each detector signal from each detector in the sparsely populated detector array;

sampling means responsive to the clock signal and to the sequential control signals for sampling the amplitudes of each integrated output signal from each image and for digitizing each integrated output signal amplitude to provide an array of digitized integrated detector signal values for each successive scanned image;

a digital memory means responsive to the clock signal and the sequential control signals and having a plurality of predetermined arrays of digital memory locations, each array of digital memory locations corresponding to a scanned image position for storing each successive array of digitized integrated detector signal values into a corresponding image position array of memory locations.

15. The infrared detector and imaging system of claim 14 wherein said integration and sampling means further comprises:

an array of integration cell circuits, each integration cell circuit being characterized to receive and integrate a corresponding detector signal.

16. The infrared detector and imaging system of claim 14 wherein each integration cell circuit is formed on an integration cell substrate.

17. The infrared detector and imaging system of claim 14 wherein each detector in the detector array on the detector substrate has a first and second electrode;

said sparsely populated detector array detectors each being formed on the surface of the detector substrate opposite the focal plane, the opposite surface having a predetermined pattern of metallurgical conductors patterned to provide a predetermined array of electrical contact pads, each pad being electrically coupled to a respective detector first electrode, all detector second electrodes being electrically common and electrically coupled to a detector array reference terminal on said detector substrate, and wherein;

the integration and sampling means has an array of integration cell circuits, each integration cell circuit being characterized to receive and integrate a corresponding detector signal, the integration cell circuits being formed on an integration cell substrate, each integration cell circuits within the array of integrated cell circuits being formed on the receiving surface of said integration substrate and characterized to receive a corresponding detector signal at a respective integration cell input pad and to integrate said detector signal; said sparsely populated detector array detector substrate predetermined pattern of metallurgical conductors patterned to provide a predetermined array of electrical contact pads being patterned to be at locations complementary to respective integrated cell input pad locations on the surface of said integration substrate when the respective surfaces are positioned and registered in opposing and stacked parallel plane relation;

said coupling means being further characterized to couple each detector first electrode to a respective integration substrate integration cell circuit input pad, the detector array reference terminal on said detector substrate being electrically coupled to an integration substrate reference terminal.

18. The infrared detector and imaging system of claim 17 wherein said coupling means for electrically coupling the detector signal from each detector in the detector array to a corresponding detector signal integration means input further comprises an arrangement wherein:

a layer of indium is applied to each electrical contact pad on the detector substrate detector surface to form indium bumps, each bump being of uniform thickness, and wherein a layer of indium is applied to each electrical contact pad to form indium bumps of uniform thickness on each integration cell substrate integration cell input, the bumps on opposing electrical pad surfaces being in registration, the bumps on opposing electrical pad surfaces merging to form a low resistance electrical contact between respective opposing electrical pads in response to the detector surface of the detector substrate being pressed against the receiving surface of the integration substrate.

19. The infrared detector and imaging system of claim 14 wherein said sparsely populated staggered detector array further comprises:

at least one pair of left and right detector arrays, each left detector array having at least a first column of detectors spaced vertically at detector row intervals on said substrate, and each right detector array having at least a first column of detectors spaced vertically at said detector row intervals on said substrate, the number of columns in each left detector array being equal to the number of columns in each right detector array, said right column detectors being vertically positioned on row locations between the rows occupied by said left detector array, each successive right detector array being horizontally positioned to the right of said left detector array at a right array displacement on said substrate.

20. The infrared detector and imaging system of claim 19 wherein said staggered detector array further comprises:
at least two pairs of left and right detector arrays,
each successive left detector array being horizontally positioned to the right of each preceding right detector array at a left array displacement on said substrate.

21. The infrared detector and imaging system of claim 20 wherein:
said left array displacement on said substrate is further characterized to be equal to said predetermined number of image shift distances minus one-half an image shift distance, and
said second number of unit column intervals on said substrate is further characterized to be equal to the number of columns in said left array minus one-half.

22. The infrared detector and imaging system of claim 14 wherein:
each said left detector array has at least two columns of detectors each column of detectors being spaced vertically detector row intervals on said substrate, and
each right detector array having at least two columns of detectors, each detector in each column being spaced vertically at detector row intervals on said substrate;
said right array column detectors being vertically positioned on rows interposed and vertically equidistant from the rows of said left array detector array;
each successive right detector array being horizontally positioned to the right of said left detector array at a right array displacement on said substrate.

23. The infrared detector and imaging system of claim 22 wherein:
each successive left detector array column of detectors is positioned to form a staircase-like pattern, each successive column being vertically positioned one uniform unit row interval below the preceding column on said substrate, and
each successive right detector array column of detectors is positioned to form a staircase-like pattern, each successive column being vertically positioned one uniform unit row interval below the preceding column on said substrate.

24. The infrared detector and imaging system of claim 23 wherein:
said right array displacement separating each successive right detector array to the right of a preceding left detector array is further characterized to be equal to the predetermined number of image shift distances plus one-half an image shift distance, and
said left array displacement separating each successive left detector array to the right of a preceding right detector array is further characterized to be equal to the predetermined number of image shift distances plus one-half an image shift distance.

25. The infrared detector system of claim 15 wherein:
said scanner system provides a scanner position signal, and
said clock means is responsive to said scanner position signal.

26. The infrared detector system of claim 14 wherein said scanner system further comprises:
a position servo means for continuously driving said scanner to position said image on said detector array to a sequence of predetermined positions, each predetermined position corresponding to said clock signal.

27. An infrared imaging system detector array responsive to the scanned image from an objective lens and scanner system, the infrared imaging system detector array comprising:
a detector substrate,
a sparsely populated staggered detector array formed on the detector substrate, the detector substrate having a focal plane surface positioned to receive said scanned image from said objective lens and scanner system, each detector in the array being responsive to incident light for providing a signal having an amplitude proportional to the intensity of the incident light received by the detector;
said sparsely populated staggered detector array having:
at least one pair of left and right detector arrays;
each left detector array having at least a first column of detectors spaced vertically at uniform detector row intervals on said substrate; and
each right detector array having at least a first column of detectors spaced vertically at said uniform detector row intervals on said substrate;
the number of columns in each left detector array being equal to the number of columns in each right detector array, said right column detectors being vertically positioned on row locations betweeen the rows occupied by said left detector array,
each successive right detector array being horizontally positioned to the right of said left detector array at a right array displacement on said substrate.

28. The infrared imaging system detector array of claim 27 wherein said sparsely populated staggered detector array further comprises:
at least two pairs of left and right detector arrays,
each successive left detector array being horizontally positioned to the right of each preceding right detector aray at a left array displacement on said substrate.

29. The infrared imaging system sparsely populated detector array of claim 28 wherein:
each said left array displacement on said substrate is further characterized to be equal to said predetermined number of image shift distances plus one-half an image shift distance, and
each said right array displacement on said substrate is further characterized to be equal to said predetermined number of image shift distances minus one-half an image shift distance.

30. The infrared imaging system sparsely populated detector array of claim 29 wherein:
each said left detector array has at least two columns of detectors each column of detectors being spaced laterally at uniform detector column intervals on said substrate, and
each right detector array having at least two columns of detectors, each detector in each column being spaced laterally at uniform detector column intervals on said substrate;

said right array column detectors being vertically positioned on rows interposed and vertically equidistant from the rows of said left array detector array;

each successive right detector array being horizontlaly positioned to the right of said left detector array at a right array displacement on said substrate.

31. The infrared imaging system sparsely populated detector array of claim 30 wherein:

each successive left detector array column of detectors is positioned to form a staircase-like pattern, the first detector in each successive column being vertically positioned one uniform unit row interval below the preceding column on said substate; and each successive right detector array column of detectors is positioned to form a staircase-like pattern, the first detector in each successive column being vertically positioned one uniform unit row interval below the preceding column on said substrate.

32. The infrared imaging system sparsely populated detector array of claim 31 wherein:

said right array displacement separating each successive right detector array to the right of a preceding left detector array is further characterized to be equal to the predetermined number of image shift distances minus one-half an image shift distance, and each said left array displacement separating each successive left detector array to the right of a preceding right detector array is further characterized to be equal to the predetermined number of image shift distances plus one-half an image shift distance.

* * * * *